United States Patent
Yabuuchi et al.

(10) Patent No.: US 10,043,963 B2
(45) Date of Patent: Aug. 7, 2018

(54) THERMOELECTRIC CONVERSION ELEMENT AND THERMOELECTRIC CONVERSION MODULE

(71) Applicant: Hitachi, Ltd., Chiyoda-ku, Tokyo (JP)

(72) Inventors: Shin Yabuuchi, Tokyo (JP); Jun Hayakawa, Tokyo (JP); Yosuke Kurosaki, Tokyo (JP); Akinori Nishide, Tokyo (JP); Yuji Suwa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 283 days.

(21) Appl. No.: 14/761,414

(22) PCT Filed: Jan. 31, 2013

(86) PCT No.: PCT/JP2013/052271
§ 371 (c)(1),
(2) Date: Jul. 16, 2015

(87) PCT Pub. No.: WO2014/118959
PCT Pub. Date: Aug. 7, 2014

(65) Prior Publication Data
US 2015/0357543 A1     Dec. 10, 2015

(51) Int. Cl.
*H01L 35/26* (2006.01)
*H01L 35/32* (2006.01)
*H01L 35/34* (2006.01)
*H01L 35/30* (2006.01)
*H01L 35/00* (2006.01)

(52) U.S. Cl.
CPC .............. *H01L 35/26* (2013.01); *H01L 35/32* (2013.01); *H01L 35/34* (2013.01); *H01L 35/00* (2013.01); *H01L 35/30* (2013.01)

(58) Field of Classification Search
CPC ......... H01L 35/26; H01L 35/32; H01L 35/34; H01L 35/00
See application file for complete search history.

(56) References Cited

FOREIGN PATENT DOCUMENTS

| JP | 2002-270907 A | 9/2002 |
|----|---------------|--------|
| JP | 2004-253618 A | 9/2004 |

OTHER PUBLICATIONS

Mingo et al., "Nanoparticle-in-Alloy Approach to Efficient Thermoelectrics: Silicides in SiGe", Nano Letters, 2009.*
Mielke, A., "Ferromagnetic ground states for the Hubbard model on line graphs", J. Phys. A: Math. Gen. 24, 1991, L73-L77.

* cited by examiner

*Primary Examiner* — Matthew T Martin
(74) *Attorney, Agent, or Firm* — Miles & Stockbridge PC

(57) ABSTRACT

In order to provide a thermoelectric conversion element which has a high Seebeck coefficient, a low thermal conductivity, and a high performance, even if the material system that has a low environmental load and can reduce the cost is used, the thermoelectric conversion element in which lattice points are classified into two or more kinds (A site and B site), lattices of which the kinds are different are connected to each other, the numbers of lattices of which the kinds are different are different (A site: 2, and B site: 1), and a lattice structure is configured by arranging nanoparticles or semiconductor quantum dots, includes areas of which conductivity types are different.

16 Claims, 13 Drawing Sheets

[Fig. 1]
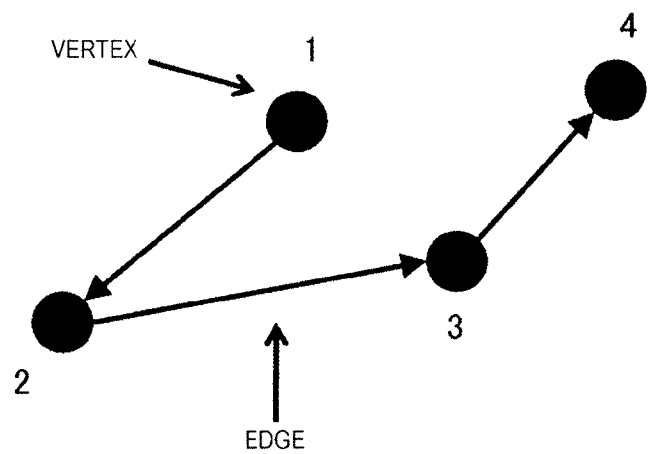
[Fig. 2]
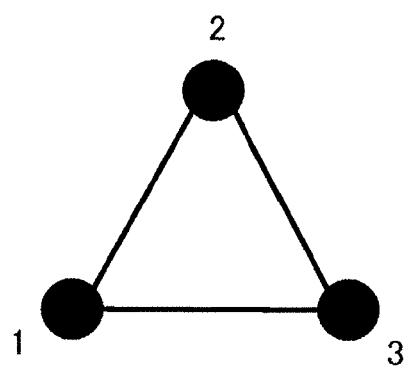

[Fig. 3]
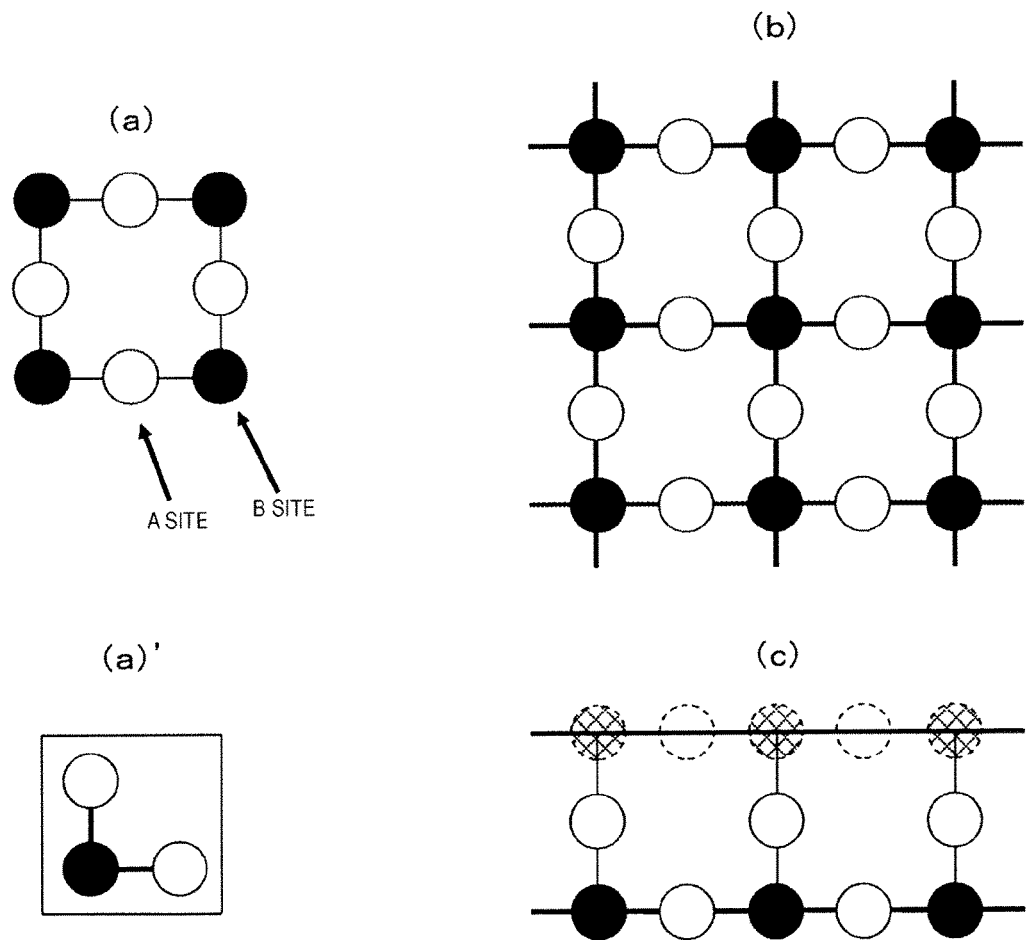
[Fig. 4]

[Fig. 5]
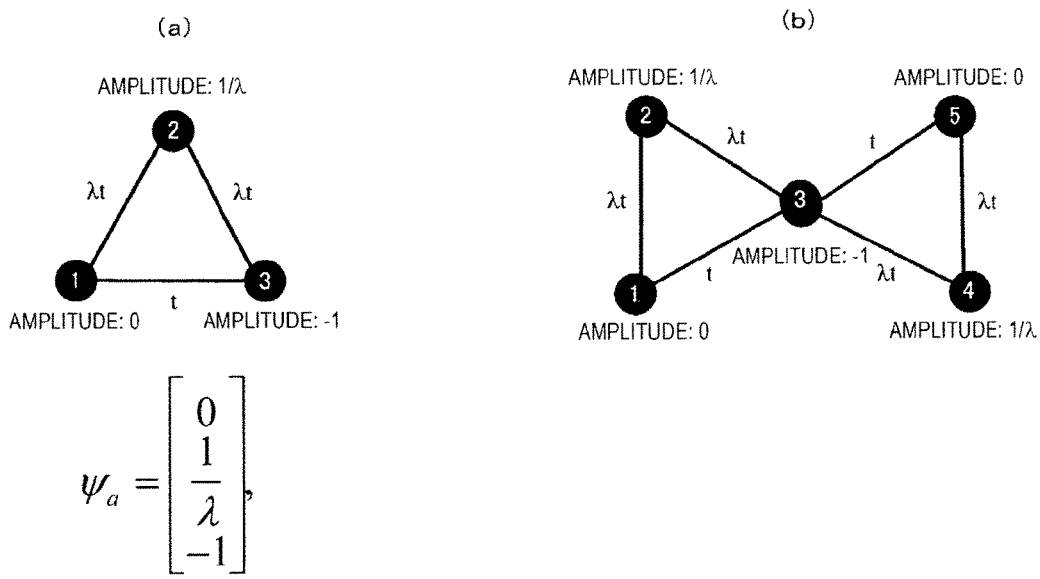
[Fig. 6]
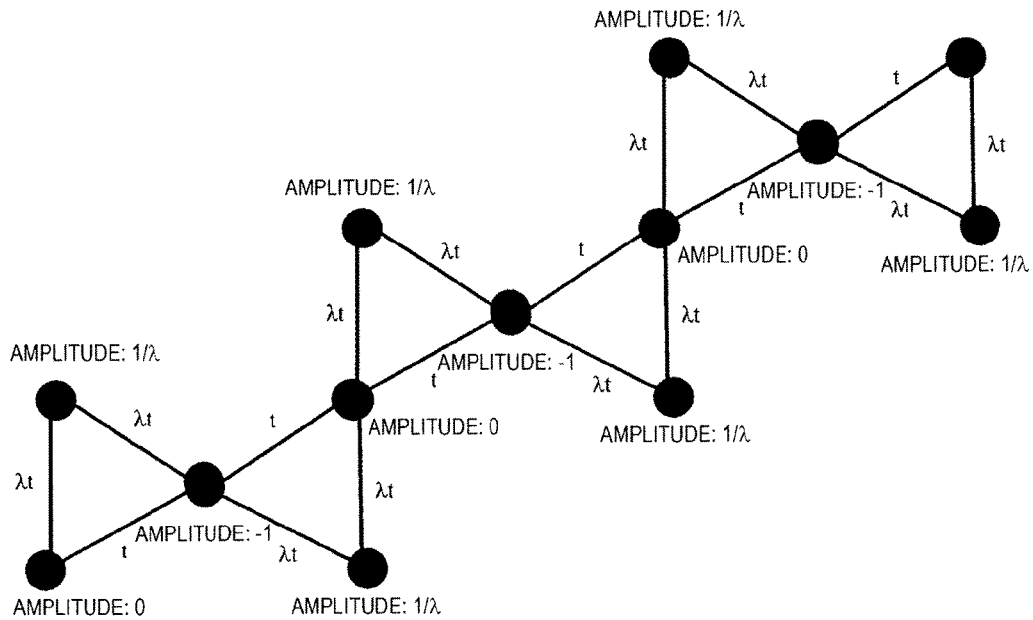

[Fig. 7]
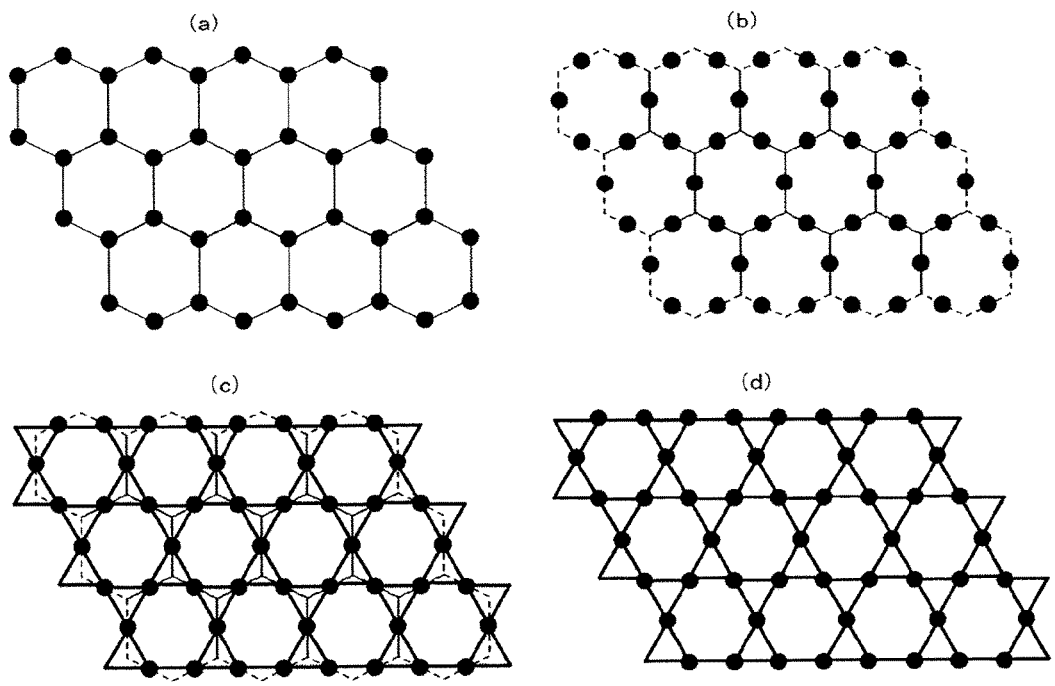

[Fig. 8]
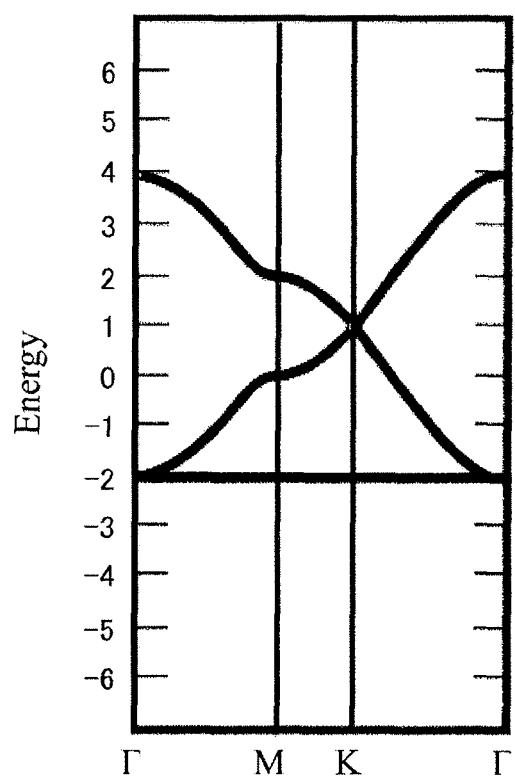

[Fig. 9A]
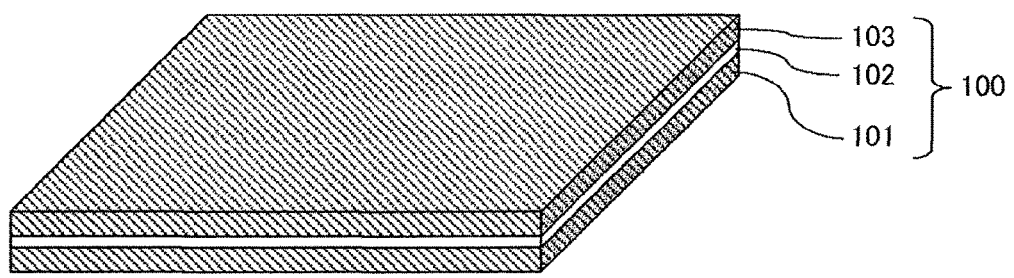
[Fig. 9B]
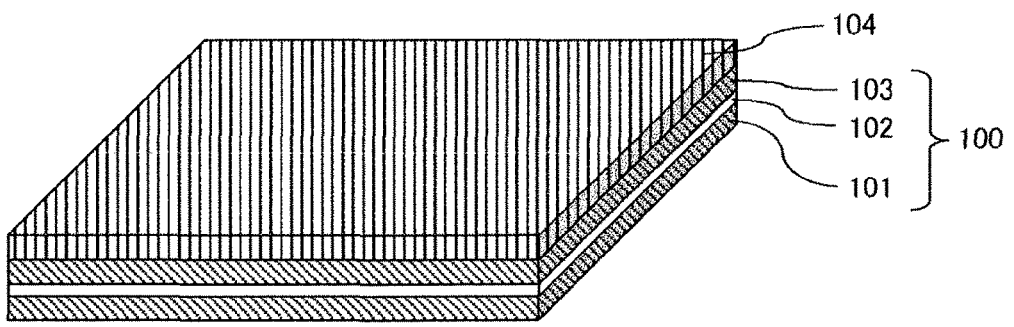
[Fig. 9C]
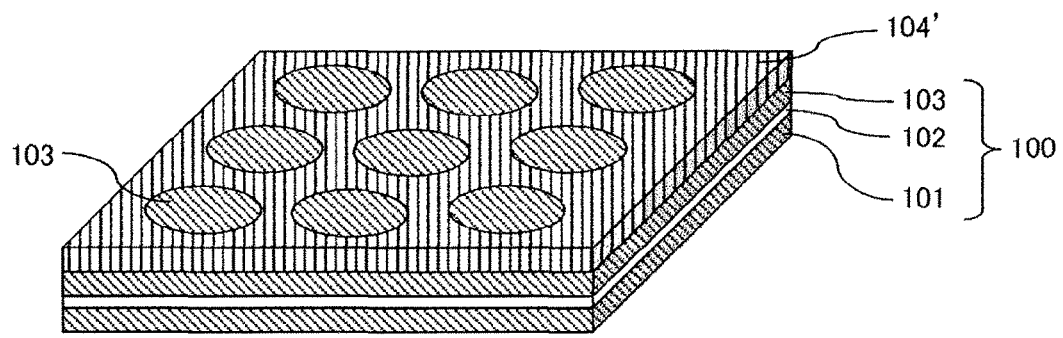

[Fig. 9D]
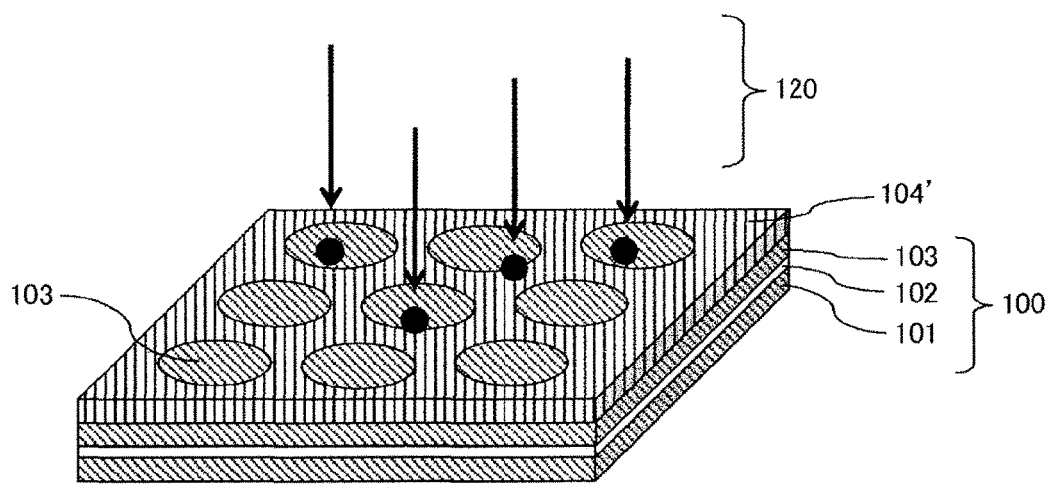
[Fig. 9E]
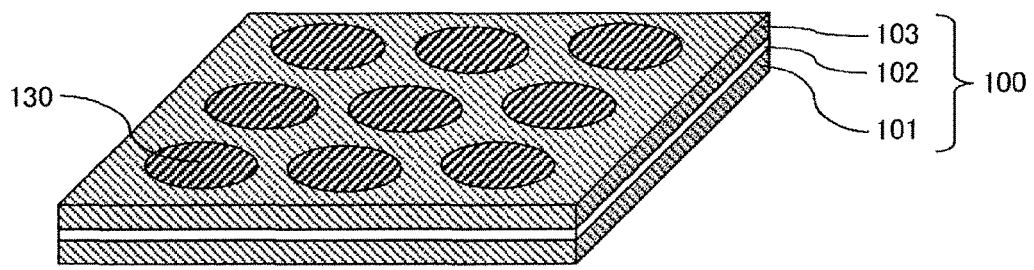

[Fig. 10A]
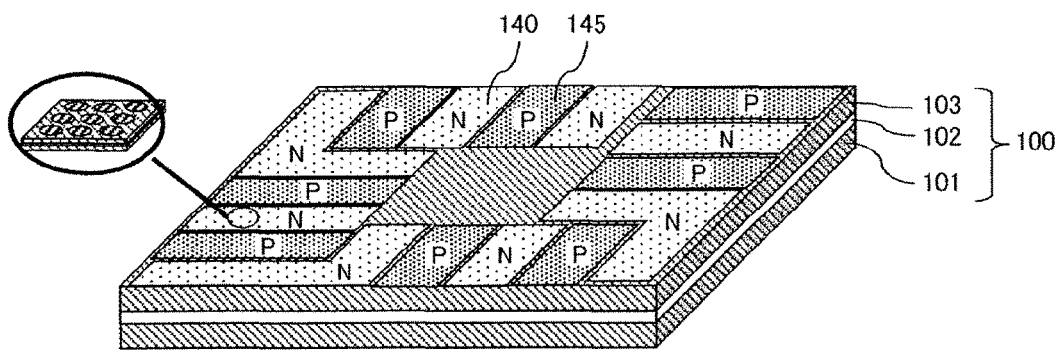
[Fig. 10B]
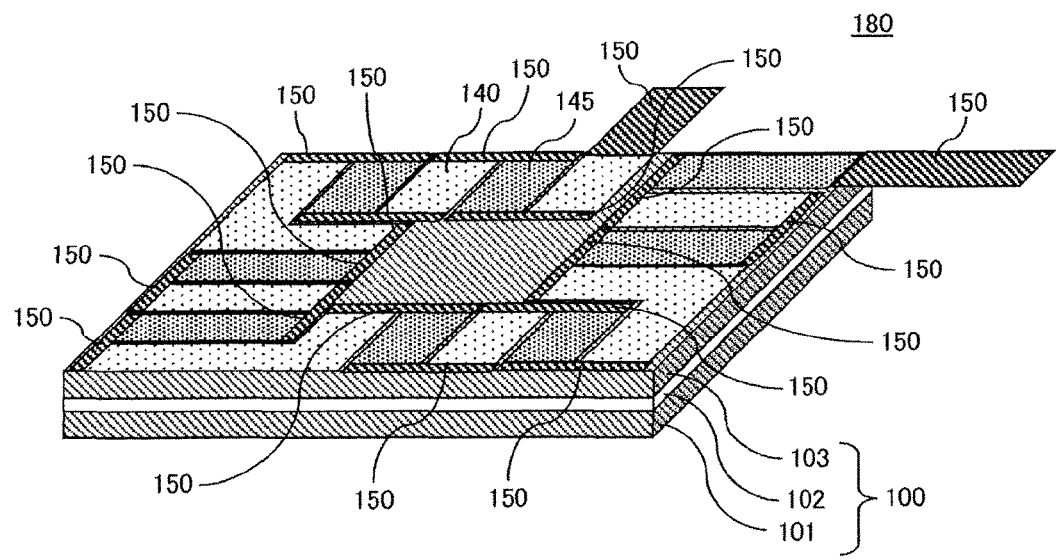

[Fig. 11A]
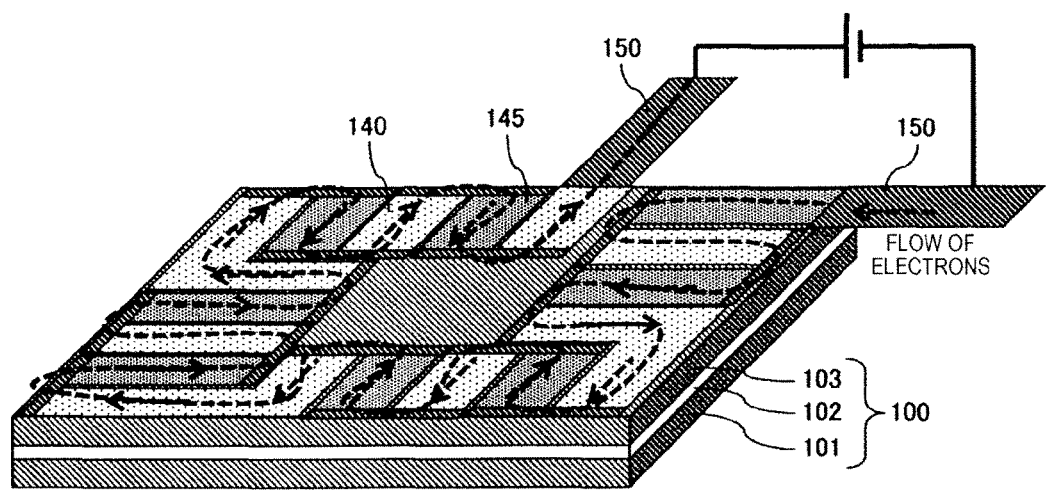
[Fig. 11B]
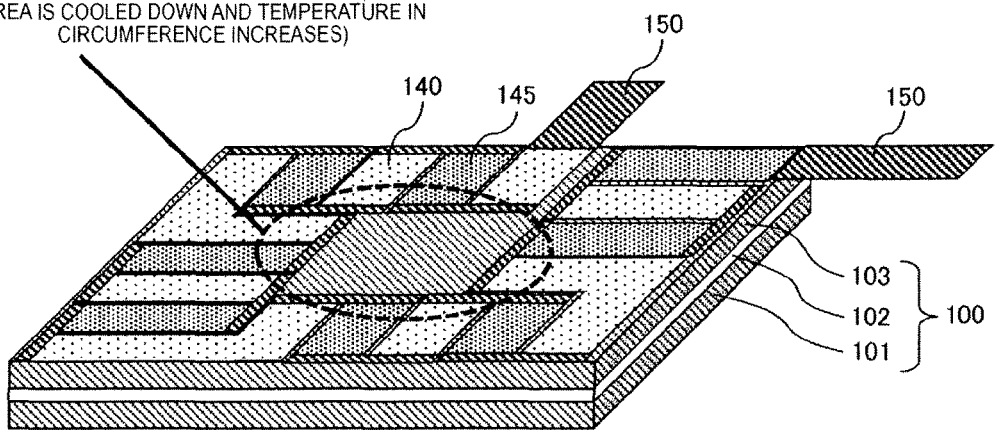

[Fig. 12A]
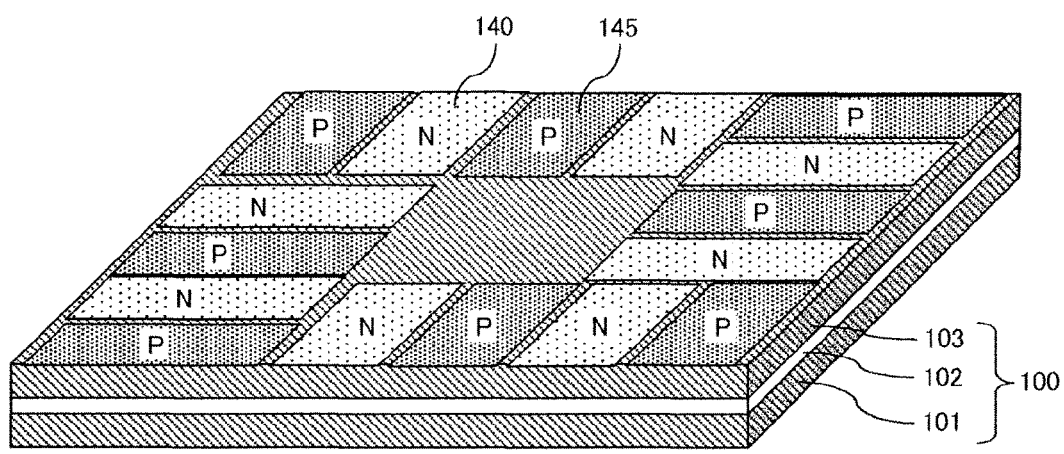
[Fig. 12B]
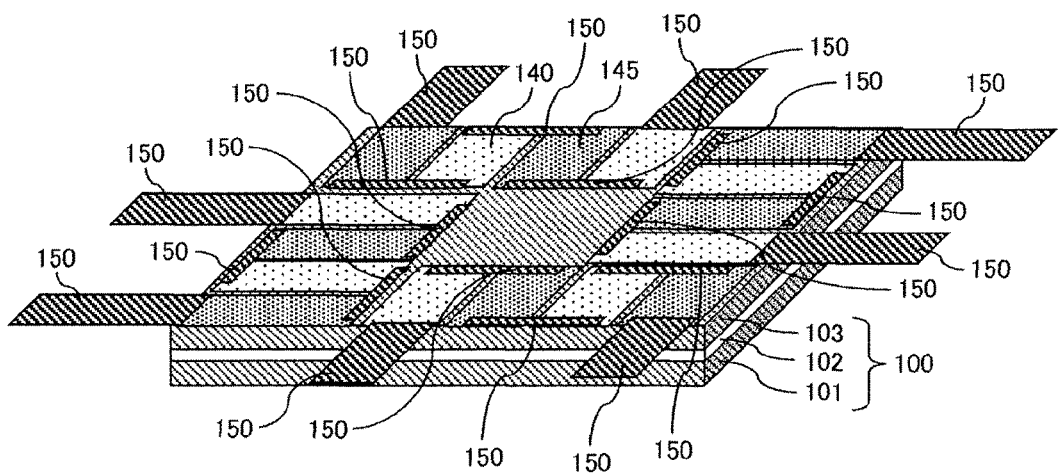

[Fig. 13A]
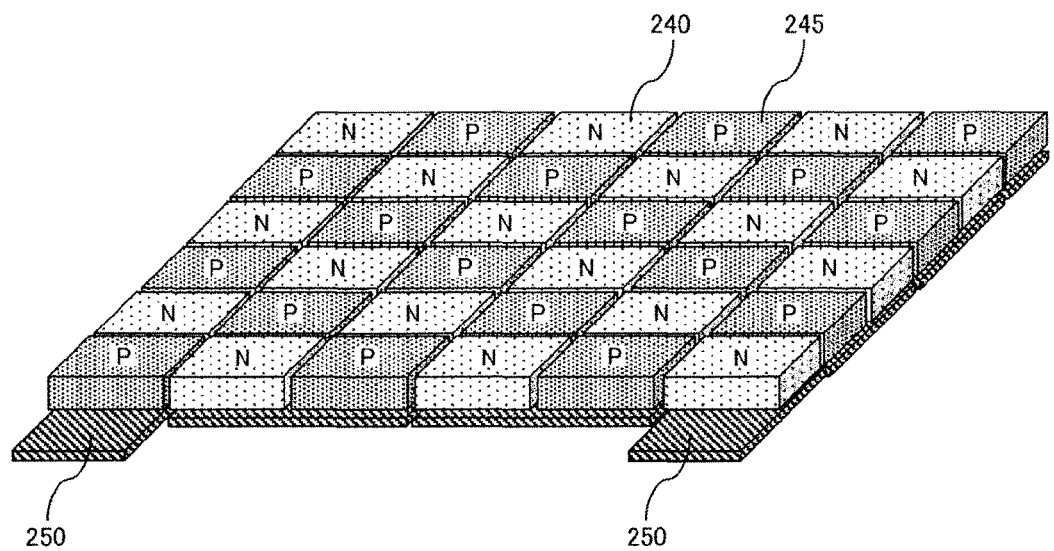
[Fig. 13B]
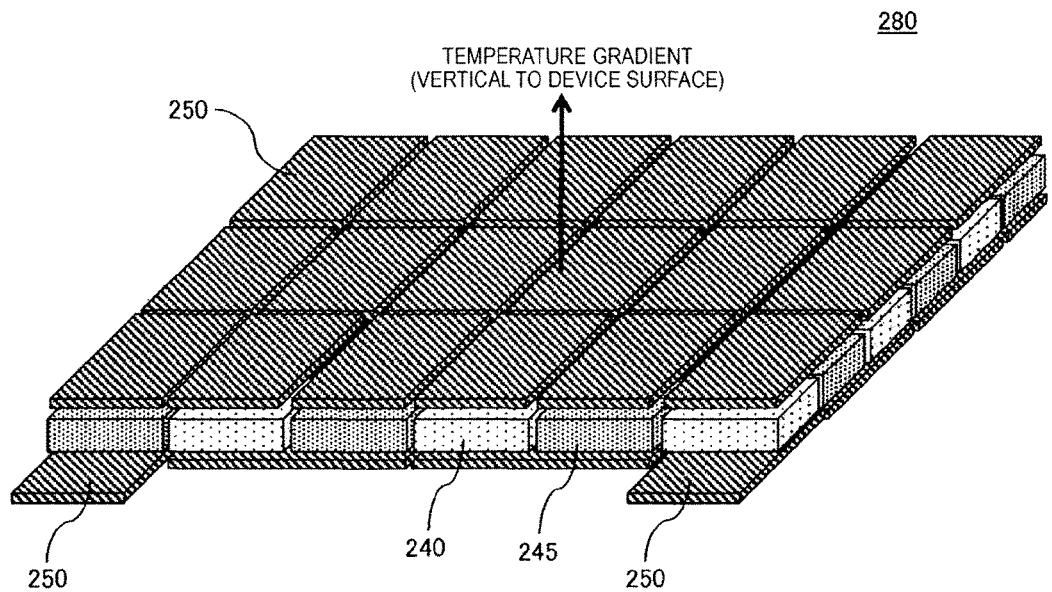

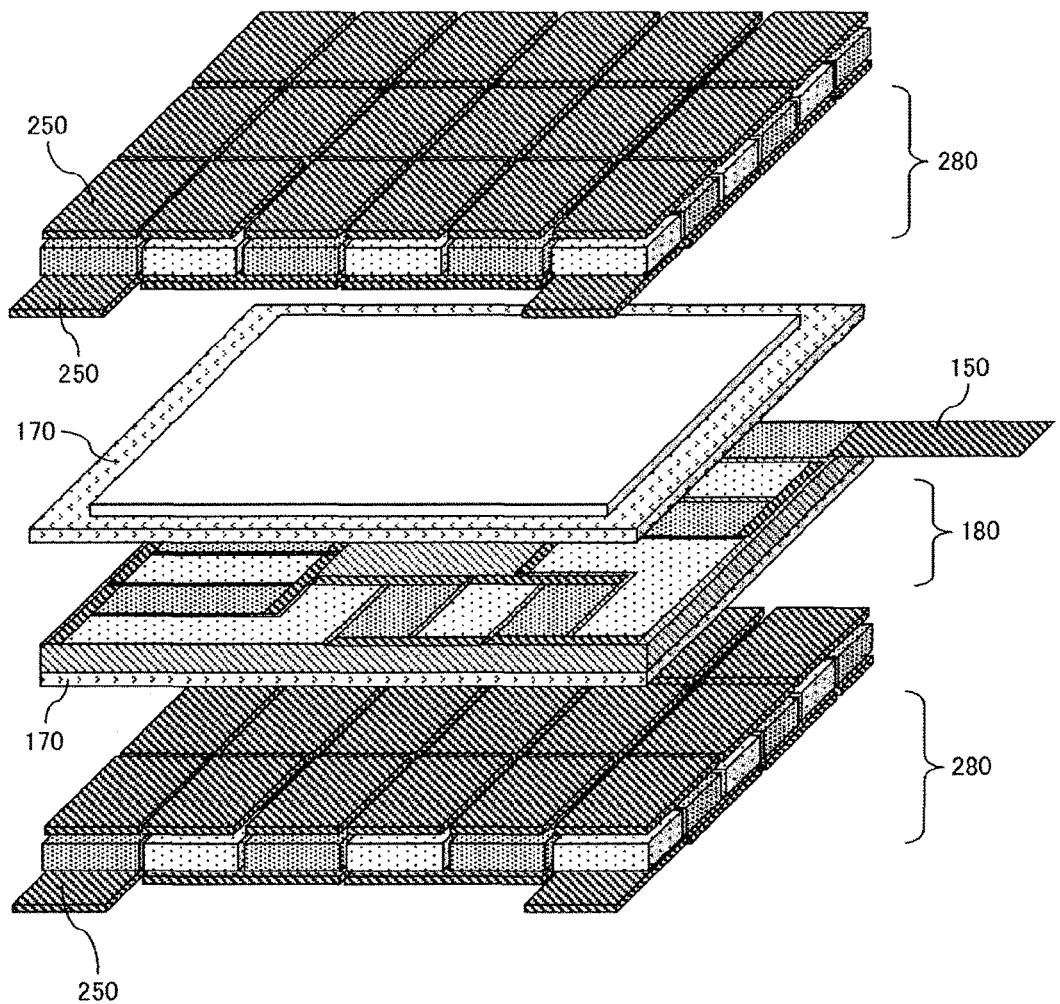
[Fig. 14A]

[Fig. 14B]
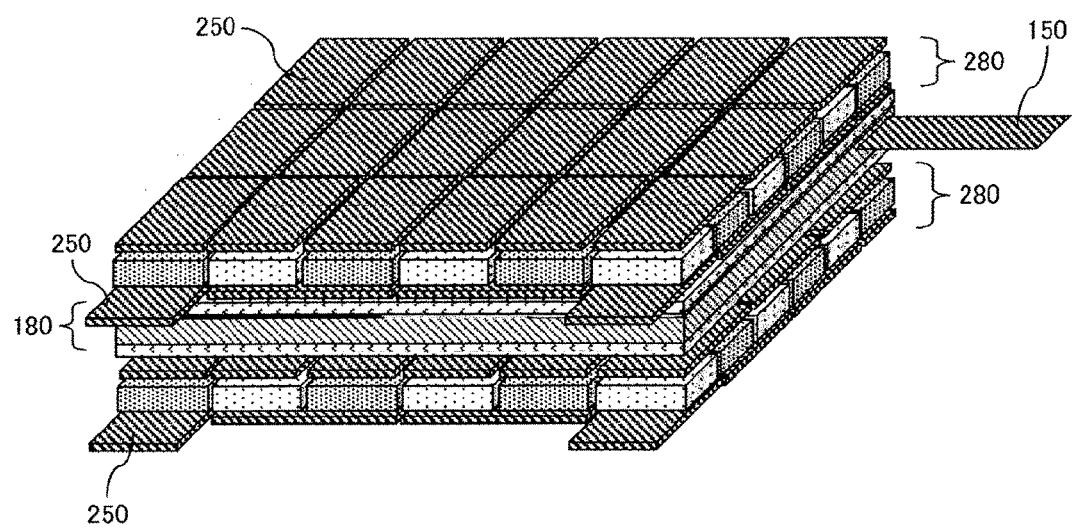

THERMOELECTRIC CONVERSION ELEMENT AND THERMOELECTRIC CONVERSION MODULE

TECHNICAL FIELD

The invention relates to a thermoelectric conversion element and a thermoelectric conversion module in which materials having nanosize lattices or fine particles are used, by using artificial organization or self-organization.

BACKGROUND ART

Currently, due to circumstances of environment, energy problems, and the depletion of resources, an active use of natural energies such as solar energy, wind power, and geothermal heat which are not accompanied by the generation of greenhouse gases without depending on fossil fuels is desired. While solar power generation, wind power generation, and the like in which environmental load is low are spread, effective use of heat energy has been attracting attention. In reality, the amount of the heat energy discharged from trash burning sites, subways, or substations which closely exist is enormous. The temperature of the waste heat discharged from trash burning sites or the like is as high as 300° C. to 600° C., and the temperature of the waste heat in subways or substations is as low as 40° C. to 80° C. Close electric appliances such as computers generate waste heat which is comparatively low (lower than 200° C.) and a lot, and waste heat is generated from various things. The total amount of the energy of the waste heat is great, but the effective energy recollection technology has not been established. As a method of using the energy of the waste heat, there is a thermoelectric conversion element which has been known since a long time ago. In the thermoelectric conversion, since electricity is directly generated from a temperature difference without a driving portion, the loss is lower than in a method of generating electricity by generating vapor by fire power or atomic power and driving a turbine. In addition, no waste matters are generated, and thus the thermoelectric conversion is environmentally friendly. In addition, if a voltage is applied to the both ends of the thermoelectric conversion element, a temperature difference is generated. The Seebeck effect of this thermoelectric conversion was discovered in 1821, but there has been a problem in that the conversion efficiency is low. Recently, as a thermoelectric conversion material having comparatively good efficiency at the temperature of 200° C. or lower, $Bi_2Te_3$ is practically applied.

In addition, a thermoelectric conversion material having comparatively good efficiency at approximate room temperature such as Bi—Te can be used as a Peltier device and a cooling element, and can be used in a cooling apparatus that does not use a coolant and has a low environmental load. Recently, according to the continuous increase of the speed of a computer, calories of the heat generated in a circuit in the computer continuously increase. In many circuits and application examples, if heat increases, the performance of a computer decreases. The circuit has to be cooled down so as to be effectively operated. In addition to the circuit in the computer, power devices such as an inverter need the cooling of other elements in some cases. In addition, if the heat can be locally and easily controlled and heat control such as cooling becomes possible, a circuit element in which an element that operates only at a low temperature and an element that generates heat are used in a mixed manner can be applied without a great-scale cooling device. In the cooling of the semiconductor device or the like, it is considered that a thermoelectric conversion material system that conforms well with a silicon is advantageous.

As described above, in viewpoints of both the reuse of waste heat and the cooling of a device, a high performance thermoelectric conversion element is required.

Performance of the thermoelectric conversion material is evaluated by a dimensionless performance index (ZT).

[Expression 1]

$$Z = \frac{\sigma S^2}{\kappa} \quad (1)$$

Here, σ is an electrical conductivity, S is a Seebeck coefficient, and K is a thermal conductivity, and a value obtained by applying a temperature T on both sides of Expression (1) is ZT. Generally, the higher ZT, the better the performance. Therefore, in Expression (1), it is found that a material in which the Seebeck coefficient S and the electrical conductivity σ in a numerator are high, and the thermal conductivity κ in a denominator is low is preferred as the thermoelectric conversion material. In a Bi—Te-based material, the conversion efficiency is as high as a performance index ZT>1, but Bi and Te are both expensive, and Te is extremely toxic. Therefore, for mass production, cost reduction, and environmental load reduction, a highly effective thermoelectric conversion material to substitute for $Bi_2Te_3$ is required.

As a material system having a low environmental load, a thermoelectric conversion material using basically a silicide semiconductor or the full Heusler alloy $Fe_2VAl$ is reported in Patent Documents 1 and 2. The silicide semiconductor is a material obtained by a compound of silicon and metal being a semiconductor, and can be configured with a very inexpensive material system. $Mg_2Si$ is based on inexpensive Mg and Si, and thus is configured with an inexpensive and intoxic material system. In addition, the full Heusler alloy is configured with inexpensive elements having low environmental loads such as Fe, V, and Al in the same manner, and thus is a material system that does not use toxic rare metals such as a Bi—Te-based material and is valuable in view of industrial applicability. However, in the temperature range of 200° C. or lower, the thermoelectric conversion characteristic thereof does not reach that of the Bi—Te-based material, and thus further research and development are required in the future.

As described above, the performance of the thermoelectric conversion element greatly changes according to the bulk characteristic of the material, but it is reported that a size effect such as particulation also can greatly improve the performance of the thermoelectric conversion element. Interfaces between particles increase by particulating the material to a nanometer size. If the interfaces between the particles increase, the increase becomes the cause of a scattering phonon and thermal conductivity can be greatly decreased. Generally, the performance index ZT of the thermoelectric conversion element is inversely proportional to thermal conductivity, and thus the decrease of thermal conductivity becomes a design guideline extremely important for the performance improvement of the thermoelectric conversion element.

In addition, as the thermoelectric conversion material having the possibility of a low environmental load and a low cost, a transition metal sulfide such as Fe or Ni is also reported in NPL 1. However, in NPL 1, doping elemental species to transition metal sulfide, dependency of concentration, or the carrier density is not controlled, and thus the selection of more optimum doping elemental species and control of the carrier density are needed in order to express a high thermoelectric conversion characteristic.

As described above, attempts to control the size and the characteristic of the material for the thermoelectric conversion element have been made up until now.

CITATION LIST

Patent Literature

PTL 1: JP-A-2004-253618
PTL 2: JP-A-2002-270907

Non-Patent Literature

NPL 1: A. Mielke, J. Phys. A: Math. Gen. 24 (1991) L73.

SUMMARY OF INVENTION

Technical Problem

In the future, as the environment and energy problems become more important, it is considered that a power generating system transitions to a clean power generating system that does not depend on fossil fuels. In the meantime, it is expected that the necessity for utilizing energy sources that have been rarely used such as geothermal energy or waste heat increases. In addition, a thermoelectric conversion element having a high performance at approximate room temperature that can be used for, for example, the reuse of the waste heat of the circuit in a computer or the cooling of a computer is needed. However, since the thermoelectric conversion element using toxic rare metals such as a Bi—Te-based material, which is practically used as a thermoelectric conversion material at a comparatively low temperature (200° C. or lower) may not be massively, cheaply, and stably supplied to the market, the possibility of the material being generally and widely spread is low.

An object of the invention is to provide a thermoelectric conversion element which has a high Seebeck coefficient, a low thermal conductivity, and a high performance, even if a material system that has a low environmental load and can reduce the cost is used, and a thermoelectric conversion module using the thermoelectric conversion element.

Solution to Problem

As an embodiment to achieve the purpose, there is provided a thermoelectric conversion element in which lattice points are classified into two or more kinds, lattices of which the kinds are different are connected to each other, the numbers of lattices of which the kinds are different are different, and the lattice structure is configured by arranging nanoparticles or semiconductor quantum dots, including: areas of which conductivity types are different.

In addition, provided is a thermoelectric conversion element in which a unit structure of a lattice is a complete graph, and the lattice structure is configured by arranging nanoparticles or semiconductor quantum dots, including: areas of which conductivity types are different.

In addition, provided is a thermoelectric conversion element in which a lattice structure obtained by causing a lattice which is a plane graph and has an auxiliary lattice structure of lattices in different kinds to be a line graph is configured by arranging nanoparticles or semiconductor quantum dots, including: areas of which conductivity types are different.

In addition, provided is a thermoelectric conversion module in which the thermoelectric conversion element described above is used.

Advantageous Effects of Invention

According to the invention, a thermoelectric conversion element which has a high Seebeck coefficient, a low thermal conductivity, and a high performance, even if a material system that has a low environmental load and can reduce the cost is used, and a thermoelectric conversion module using the thermoelectric conversion element can be provided.

BRIEF DESCRIPTION OF DRAWINGS

FIG. 1 is an explanatory diagram of a graph in a graph theory.

FIG. 2 illustrates a triangle lattice which is an example of a complete graph.

FIG. 3 is an example of a Lieb-type lattice, in which FIGS. 3(a) and 3(a)' are diagrams of a unit cell, FIG. 3(b) is a diagram in which the unit cells illustrated in FIG. 3(a) are periodically arranged in a two-dimensional direction, and FIG. 3(c) is a diagram in which the unit cells illustrated in FIG. 3(a)' are periodically arranged in a one-dimensional direction.

FIG. 4 illustrates an example of a unit cell of a Tasaki-type lattice, in which FIG. 4(a) illustrates a triangle unit cell and FIG. 4(b) illustrates an extended triangle unit cell.

FIG. 5 is a diagram for describing an order of creating the Tasaki lattice, in which FIG. 5(a) illustrates an extended unit cell, and FIG. 5(b) illustrates a connection cell.

FIG. 6 is a diagram for describing an order of creating the Tasaki lattice, and illustrates a cell structure of the connection at the end having an amplitude of 0.

FIG. 7 is a diagram for describing a method of creating a line graph, in which FIG. 7(a) illustrates a hexagonal lattice, FIG. 7(b) illustrates a first step in which a lattice changes from a hexagonal lattice to a kagome lattice, FIG. 7(c) illustrates a second step in which the lattice changes from the hexagonal lattice to the kagome lattice, and FIG. 7(d) illustrates the kagome lattice.

FIG. 8 is a band diagram of the kagome lattice.

FIG. 9A is a perspective view for describing a process of forming a fine particle thermoelectric element that configures a thermoelectric conversion element according to a first embodiment of the invention, and illustrates a process of preparing a SOI substrate.

FIG. 9B is a perspective view for describing a process of forming a fine particle thermoelectric element that configures the thermoelectric conversion element according to the first embodiment of the invention, and illustrates a process of applying resist on the surface of the SOI substrate.

FIG. 9C is a perspective view for describing a process of forming a fine particle thermoelectric element that configures the thermoelectric conversion element according to the first embodiment of the invention, and illustrates a lithography process on a resist film formed by applying resist on the surface of the SOI substrate.

FIG. 9D is a perspective view for describing a process of forming a fine particle thermoelectric element that configures the thermoelectric conversion element according to the first embodiment of the invention, and illustrates a process of doping a desired metallic element on a Si layer of a SOI substrate by ion implantation using a patterned resist film as a mask.

FIG. 9E is a perspective view for describing a process of forming a fine particle thermoelectric element that configures a thermoelectric conversion module according to the first embodiment of the invention, and illustrates a process of forming a Si artificial lattice by causing an ion implanted Si layer to be silicide.

FIG. 10A is a perspective view for describing a process of manufacturing the thermoelectric conversion module according to the first embodiment of the invention, and illustrates a state in which plural N-type areas and plural P-type areas are formed on the Si layer on the SOI substrate by the processes illustrated in FIG. 9A to 9E.

FIG. 10B is a perspective view for describing a process of manufacturing the thermoelectric conversion module according to the first embodiment of the invention, and illustrates a state in which plural N-type areas and plural P-type areas all are connected in series, and two extraction electrodes are formed.

FIG. 11A is a perspective view for describing the flow of electrons when a voltage is applied to the thermoelectric conversion module illustrated in FIG. 10B.

FIG. 11B is a perspective view for describing the temperature change of the thermoelectric conversion module when a voltage is applied to the thermoelectric conversion module as illustrated in FIG. 11A.

FIG. 12A is a perspective view for describing a process of manufacturing another thermoelectric conversion module according to the first embodiment of the invention, and illustrates a state in which p-type areas and n-type areas are formed by the processes illustrated in FIGS. 9A to 9E on the Si layer on the SOI substrate.

FIG. 12B is a perspective view for describing a process of manufacturing the thermoelectric conversion module according to the first embodiment of the invention, and illustrates a state in which P-type areas and N-type areas are partially connected in series, and multiple extraction electrodes are formed in the circumference.

FIG. 13A is a perspective view for describing a thermoelectric conversion module in the related art, and illustrates a state in which plural P layers and plural N layers are disposed on plural lower electrodes.

FIG. 13B is a perspective view for describing the thermoelectric conversion module in the related art, and illustrates a state in which plural upper electrodes are disposed in a manner of being deviated to plural lower electrodes so that the plural N layers and the plural P layers illustrated in FIG. 13A are all connected in series.

FIG. 14A is a perspective view for describing a state right before the organization of a thermoelectric conversion module according to a second embodiment of the invention.

FIG. 14B is a perspective view of the thermoelectric conversion module according to the second embodiment of the invention.

DESCRIPTION OF EMBODIMENTS

As a cheap material system which conforms well with a semiconductor device such as Si, a IV-group semiconductor material that mainly contains Si and Ge is included. In addition, silicide which is a compound of Si and metal or germanide which is a compound of Ge and metal is a material that conforms well. A thermoelectromotive force strongly depends on the electronic state of a material, and a material that produces a sharp change in the density of states around the Fermi level is preferred. As a material that produces a sharp change in the density of states, a material system such as a transition metal in which electrons in a d-orbital contribute to an electronic state around the Fermi level becomes one candidate, because the material needs to be in a localized electronic state.

As the relatively cheap transition metal, iron (Fe) or manganese (Mn) is included. If the material system is a material system where a state derived from 3d of Fe is around the Fermi level as a mother phase, a large amount of earth-crust deposits exists, and it is possible to manufacture the thermoelectric conversion material having a low environmental load. Accordingly, together with Si, Ge, or the like, it is preferable to use silicide semiconductor fine particles such as $Mn_4Si_7$ and $\beta$-$FeSi_2$. Material systems such as $MoSi_2$, $TiSi_2$, $TiGe_2$, $ZrSn_2$, $V_{17}Ge_{31}$, $Cr_{11}Ge_{19}$, $Mo_9Ge_{16}$, $Mo_{13}Ge_{23}$, $Ru_2Ge_3$, $RU_2Si_3$, $Os_2Ge_3$, $Os_2Si_3$, $Rh_{17}Ge_{22}$, $Mn_4Si_7$, $Re_4Ge_7$, $Mn_{11}Si_{19}$, $Mn_{15}Si_{26}$, $Mn_{27}Si_{47}$, $Mn_{26}Si_{45}$, $Mn_7Si_{12}$, $Mn_{19}Si_{33}$, $Mn_{39}Si_{68}$, $Ir_4Ge_5$, and $Co_2Si_3$ may be used. Bi—Te-based materials which have difficulty in being manufactured on a semiconductor device such as Si, $FeS_2$, $AuSb_2$, $CaC_2$, $CoS_2$, $MnS_2$, $NiS_2$, $NiSe_2$, $OsS_2$, $OsTe_2$, $PdAs_2$, $PtAs_2$, $PtBi_2$, $RhSe_2$, and $RuS_2$ that have a pyrite structure, and an oxide, a Heusler alloy, a clathrate material, and the like may be used.

The material system is formed to be nanoparticles and dispersed, or is regularly arranged as an artificial lattice so that the higher density of states and the higher thermoelectromotive force than those in a simple material system are realized. Therefore, it is considered that a preferred form as an artificial lattice is an artificial lattice that can form a flat band. The flat band is a band structure in which the energy dispersion of electrons rarely has wavenumber dependence, and if the band structure can be artificially manufactured, a great thermoelectromotive force is expected. Existence of plural lattices having flat bands is clearly disclosed by Lieb, Tasaki, Mielke, et al. These three lattice structures are described as follows.

In order to describe a lattice having a flat band, definitions of concepts necessary for a graph theory to define a shape are described.

1. Q is a finite set, and E is a set made of 2 points of Q. A set made of Q and E is called a graph, an element of Q is called a vertex of a graph, and an element of E is called an edge of a graph. In addition, Q is called a vertex set, and E is called an edge set, and the graph is written as G.

2. With respect to Q={1, 2, . . . , n}, when E includes all of $_nC_2$ vertex pairs, a graph made of Q and E is called a complete graph of n vertexes.

3. Plane graph: A graph in which plural edges are met only at vertexes is called a plane graph.

An example of a graph is illustrated in FIG. 1. In FIG. 1, an example in which a vertex (black circle) set of a graph $G_1$ is $Q_1$={1, 2, 3, 4}, and an edge set is $E_1$={{3, 2}, {2, 1}, {3, 4}} is illustrated. As illustrated in FIG. 1, the connection between lattices can be defined by a set of vertexes (black circles) and edges (lines connecting vertexes). In addition, a triangle lattice which is an example of a complete graph is illustrated in FIG. 2. As illustrated in FIG. 2, when the entire vertex set is connected to all vertexes by edges, the graph is called a complete graph. In this manner, a shape of a dimensional artificial lattice can be defined by periodically arranging the graph as a unit. A design guideline for an actual artificial lattice can be obtained by positioning vertex portions in the graph to arrange fine particles or quantum dots and associating edges with semiconductor thin lines or metal thin lines in which electrons can move or a joining portion between fine particles.

Example 1 of Preferred Shapes of Artificial Lattice: Lieb-Type Lattice

FIG. 3 is an example of the Lieb-type lattice, FIGS. 3(a) and 3(a)' are diagrams of unit cells, FIG. 3(b) is a diagram illustrating the unit cell illustrated in FIG. 3(a) periodically arranged in the two-dimensional direction, and FIG. 3(c) is a diagram illustrating the unit cell illustrated in FIG. 3(a)' periodically arranged in the one-dimensional direction. The Lieb-type lattice is a lattice formed of two auxiliary lattices of A and B as illustrated in FIG. 3(a), and has a structure in which edges are formed between A and B. In addition, there is a characteristic in that the numbers of lattice points of A and B are different. FIG. 3 illustrates an example in which the ratio between the lattice points (A:B) becomes 2:1. In FIG. 3(a), vertexes B in the 4 corners respectively count by ¼ so that a total thereof becomes 1 point, and four edges A respectively count by ½ so that a total thereof becomes 2 points. Then, the lattice can be written as FIG. 3(a)'. If the Hamiltonian having the lattice structure is considered,

[Expression 2]

$$H = \begin{bmatrix} 0 & T_{BA} \\ T_{AB} & 0 \end{bmatrix} \quad (2)$$

Expression (2) above can be obtained. Here, $T_{BA}$ and $T_{AB}$ are integrals of movements from A site to B site, and $T_{AB}$ is a matrix of "the number of A sites"×"the number of B sites". If rows and columns of Expression (2) are converted,

[Expression 3]

$$H = \begin{bmatrix} T_{BA} & 0 \\ 0 & T_{AB} \end{bmatrix} \quad (3)$$

Expression (3) can be obtained. Since the numbers of lattice points of A and B are different, if "the number of A sites">"the number of B sites", H has at least "the number of A sites"−"the number of B sites" items of zero unique values. In the case of the periodical lattice, this means that the periodical lattice becomes a flat band. Accordingly, an important rule in the Lieb-type lattice, the Lieb-type lattice is formed of the lattice formed of two auxiliary lattices of A and B, and the numbers of lattice points of A and B become different, and the structure satisfying this condition is preferable. The structure in FIG. 3 is an example, and may be a two-dimensional lattice (FIG. 3(b)) which is formed of the lattice formed of two auxiliary lattices of A and B, and in which units of which the numbers of lattice points of A and B as illustrated in FIG. 3(a) are different are two-dimensionally and periodically arranged or may be a one-dimensional lattice (FIG. 3(c)) in which shapes illustrated in FIG. 3(a)' are one-dimensionally and periodically arranged. In addition, since FIG. 3(c) is periodical only in one-dimensional direction, not all B sites in the four corners are shown as illustrated in FIG. 3(a), sites on the upper column do not exist, and dotted line portions are described for easier understanding of the association with the unit cell.

Example 2 of Preferred Shapes of Artificial Lattice: Tasaki-Type Lattice

The Tasaki-type lattice has a characteristic in that a cell as a unit is a complete graph. The Tasaki lattice is a lattice in which a method of selecting basic cells is important, and even if the localization unique state that occurs in cells as a unit connects cells, the localization unique state is continued without changing the formation, so that a flat band is created. The triangle lattice illustrated in FIG. 2 is an example of the complete graph, and all lattice points are connected by edges. If the value of the integral of the movement is set to be 1, and an on-site energy is set to be 1, the Hamiltonian of the triangle unit cell as illustrated in FIG. 4(a)

[Expression 4]

$$H = \begin{bmatrix} 1 & 1 & 1 \\ 1 & 1 & 1 \\ 1 & 1 & 1 \end{bmatrix} \quad (4)$$

is expressed as Expression (4) above. The unique value has a zero unique value subjected to the two-fold degeneration. In the Tasaki-type lattice, the localization unique state is maintained by connecting the unique state having the zero unique state well so that a lattice having a flat band can be created. Hereinafter, the order of creating the Tasaki-type lattice first is set by paying attention to the unique state having zero unique values of unit cells that become a complete graph. The Hamiltonian H of an extended triangle unit cell as illustrated in FIG. 4(b)

[Expression 5]

$$H = t \begin{bmatrix} 1 & \lambda & 1 \\ \lambda & \lambda^2 & \lambda \\ 1 & \lambda & 1 \end{bmatrix} \quad (5)$$

is expressed as Expression (5) above. Here, t is a value of the integral of the movement, and $\lambda$ is a constant. $\Psi_a$ which is one of the unique states of zero unique values in this system

[Expression 6]

$$\psi_a = \begin{bmatrix} 0 \\ \frac{1}{\lambda} \\ -1 \end{bmatrix}, \quad (6)$$

is expressed as Expression (6) above. Accordingly, in the unique state, electrons in the respective sites (1 to 3) as illustrated in FIG. 5(a) become in states of respective amplitudes (0, 1/$\lambda$, −1). Subsequently, two unit cells as illustrated in FIG. 5(a) are combined so that sites having an amplitude of −1 as illustrated in FIG. 5(b) are overlapped. The Hamiltonian $H_2$ in the connection system as illustrated in FIG. 5(b)

[Expression 7]

$$H_2 = t \begin{bmatrix} 1 & \lambda & 1 & 0 & 0 \\ \lambda & \lambda^2 & \lambda & 0 & 0 \\ 1 & \lambda & 2 & \lambda & 1 \\ 0 & 0 & \lambda & \lambda^2 & \lambda \\ 0 & 0 & 1 & \lambda & 1 \end{bmatrix} \quad (7)$$

is expressed as Expression (7) above. $\Psi_{H2}$ which is one of the unique states of the zero unique values at this point

[Expression 8]

$$\psi_{H2} = \begin{bmatrix} 0 \\ 1/\lambda \\ -1 \\ 1/\lambda \\ 0 \end{bmatrix}, \quad (8)$$

is expressed as Expression (8) above. This is a localization state in which an amplitude on an end becomes 0. FIG. 6 is a diagram for describing the order of creating the Tasaki lattice, and illustrates a cell structure of the connection at the end having an amplitude of 0. If a connection cell having a state in which the amplitude at the end is 0 is created, it is confirmed that, even if sites of which the amplitudes are 0 are connected, a localization state maintains the formation, and continues to be a unique function of all the Hamiltonian zero unique values. Also, the localization unique state is overlapped with the localization unique state that expands to a neighboring unit cell, and the unique state of the flat band is a multiple-fold degenerated non-orthogonal localization state as in the Lieb-type lattice. According to the order described above, a lattice having a flat band can be manufactured. Accordingly, a flat band can be realized by using the lattice formed by connecting the unit cells which is a complete graph, and a lattice having a unit cell of a complete graph shape having a localization state is one of the preferred shapes.

Example 3 of Preferred Shapes of Artificial Lattice: Mielke-Type Lattice

A Mielke-type lattice is a plane graph, and has a characteristic in which a structure of a line graph $L_G$ when the lattice in two AB auxiliary lattices of a lattice called A and a lattice called B is the graph G is a lattice. Hereinafter, a method of creating a line graph is described in detail with reference to FIG. 7. A graph $G_h$ having a formation of a hexagonal lattice is illustrated in FIG. 7(a). The hexagonal lattice can be viewed as a structure in which lattices in the same kind form an auxiliary lattice. New vertexes are positioned on median points of respective edges in the hexagonal lattice-based graph $G_h$. If the vertexes are disposed in that manner, the disposition becomes as illustrated in FIG. 7(b) (first step). If edges in $G_h$ on which newly disposed different vertexes are mounted are connected by one vertex of $G_h$, the two edges are connected by a new edge so that the disposition becomes as illustrated in FIG. 7(c) (second step). As illustrated in FIG. 7(d), a new graph obtained by a series of operations described above is called "line graph of $G_h$", and is represented by $L_G$. According to the relationship between FIGS. 7(a) and 7(d), the line graph of the hexagonal lattice shaped graph becomes the kagome lattice (refers to a pattern in which atoms or the like in the crystal lattice are arranged in a reticular pattern). Accordingly, it is found that the kagome lattice is a kind of the Mielke-type lattice. In addition, with respect to the Mielke-type lattice having the structure as described above, if the Hamiltonian is solved by using a tight binding model, a flat band exists. A value of the integral of the movement of the kagome lattice is set to be 1, and a diagram of a band when the Hamiltonian is solved by a tight binding model is illustrated in FIG. 8. In reality, it is found that there is a flat band when the energy E=−2. Accordingly, the artificial lattice shape which is the plane graph as described above and which has a structure of a line graph $L_G$, when a lattice in two AB auxiliary lattices of a lattice called A and a lattice called B is set to be a graph G, set to be a lattice is preferred.

As described above, the lattice can be configured by arranging nanoparticles or quantum dots. An artificial lattice may be configured by disposing nanoparticles at lattice points. In addition, intersection areas of semiconductor thin lines are known to function as quantum dots, and the quantum dots areas may be considered as lattice points. With respect to the lattice structure as described above, the lattice structure may be manufactured by using electron beam lithography. In addition, self-organization of fine particles may be used. Even if the lattice structure is manufactured by any one method, a crystalline structure of a thermoelectric conversion material can be easily confirmed by X-ray diffraction (XRD). In addition, the crystalline structure of monocrystal or polycrystal can be checked by observing a lattice image by an electron microscope such as a transmission electron microscope (TEM) or using a spot-shaped pattern or a ring-shaped pattern in the electron beam diffraction image. The composition distribution of a sample can be checked by using an electron probe microanalyser (EPMA) such as energy dispersive X-ray spectroscopy (EDX), or a method such as a secondary ionization mass spectrometer (SIMS), X-ray photoelectron spectroscopy, or inductively coupled plasma (ICP). In addition, the information of the density of states of the material can be checked by ultraviolet photoelectron spectroscopy, X-ray photoelectron spectroscopy, or the like. Electrical conductivity and the carrier density can be checked by the electrical measurement using a four-terminal method and the Hall effect measurement. The Seebeck coefficient can be checked by providing temperature difference on both ends of the sample and measuring the voltage difference on both ends. Thermal conductivity can be checked by a laser flash method. In addition, the arrangement of the artificial lattice can be easily checked by a scanning electron microscope (SEM) or a TEM.

Hereinafter, an example of manufacturing a sample having the configuration described above is described. Here, the manufacturing example is an example, and it is obvious that the invention is not limited to the manufacturing condition.

(Sample Manufacturing Example 1)

A thin film having a thickness of about 300 nm by performing sputtering on a Si substrate having a thermal oxide film by using a mixed target in which a composition of Si and Mn was 3:1 was manufactured, and heat treatment was performed in the condition of 800° C. in a nitrogen atmosphere for one hour. Thereafter, the thin film was immersed in a potassium hydroxide solution of 1 mol/l for about 20 seconds. As a result of measuring the roughness of the surface with an atomic force microscope (AFM), the roughness of the surface was increased. This is because a Si area was dissolved and $MnSi_{1.75}$ was exposed to the surface by being immersed in the potassium hydroxide solution. As a result of structural analysis by performing X-ray diffraction on a thin film, a peak of $Mn_4Si_7$ crystal was observed. In addition, the particle diameter was measured by using the AFM and the TEM to check the manufacture of the fine particles in the range of 5 nm to 20 nm.

(Sample Manufacturing Example 2)

Mn was injected to silicon on an insulator (SOI) substrate having a Si monocrystal having a thickness of 100 nm on a Si substrate having an oxide film by an ion implantation method, and heat treatment was performed in the condition of 700° C. in a nitrogen atmosphere for one hour. Thereafter, the particle diameter was measured by using a TEM to observe fine particles of 5 nm to 10 nm, and a thin film in which fine particles of $Mn_4Si_7$ crystal are distributed using Si as a host from electron beam diffraction was manufactured.

(Sample Manufacturing Example 3)

A resist film for positive electron beam lithography was formed on a SOI substrate having a Si monocrystal layer of about 20 nm by spin coating, and the resist film was patterned to be a kagome lattice structure. Thereafter, post baking was performed at 150° C., and then the resist film was immersed in HF having the concentration of about 5% for several seconds, was rinsed by water, and was immersed in the potassium hydroxide solution of 1 mol/l for about two minutes. Thereafter, the resist film was removed and an artificial lattice structure of Si of a kagome lattice structure was obtained.

(Sample Manufacturing Example 4) A resist film for negative electron beam lithography was formed on a SOI substrate having a Si monocrystal layer of about 20 nm by spin coating, and an area in which resist in a kagome lattice structure was removed was patterned. Thereafter, on a sample on which a resist film was attached, a Mn metal film was stacked by 10 nm by a sputtering apparatus, and was lifted off, to obtain an SOI substrate on which the Mn metal film having the kagome lattice structure was firmly stacked. Thereafter, heat treatment was performed in the condition of 700° C. in a nitrogen atmosphere for one hour. The sample was immersed in a potassium hydroxide solution of 1 mol/l for about 2 minutes. If the thin film was checked with the SEM, the kagome lattice structure was obtained, and the thin film was checked with the XRD, the thin film having the kagome lattice structure was a $Mn_4Si_7$ crystal film.

(Sample Measurement Example 1)

A temperature difference between the room temperature and 20° C. was created in the samples manufactured in Manufacturing Examples 3 and 4 to measure a Seebeck coefficient. As a result, high Seebeck coefficients of 350 μV/K and 300 μV/K were obtained respectively. Accordingly, it was confirmed that a thin film of a kagome lattice structure expressed a high Seebeck coefficient, and was a material system having a high thermoelectromotive force.

In addition to the above, the method of manufacturing a sample such as a thin film may use a vacuum vapor deposition method such as molecular beam epitaxy, and may be chemical vapor growth using a transition metal complex or the like. Artificial fine particles or nanowires may be manufactured by using a method of general chemical vapor deposition (CVD) and then the artificial fine particles or nanowires are dispersed to manufacture the lattice structure by using a method such as self-organization. As a method of manufacturing fine particles subjected to the self-organization, a molecule containing Si or a transition metal complex may be heated and circulated in the organic solvent and the molecular may be thermally decomposed in the organic solvent to manufacture the fine particles.

Here, as embodiments using Si and $Mn_4Si_7$ as a material for manufacturing the kagome lattice are described, but a material system in which doping is performed using a material system such as $TiSi_2$, $TiGe_2$, $V_{17}Ge_{31}$, $Cr_{11}Ge_{19}$, $Mo_9Ge_{16}$, the full Heusler alloy, the half Heusler alloy, and $\beta$-$FeSi_2$ as a base material may be used.

As described above, the high thermoelectromotive force can be realized by controlling the lattice structure of various material systems, building an artificial band structure, and modulating the electronic state in the Fermi level. In addition, cost can be significantly reduced compared with a Bi—Te system by combining cheap materials with less fear of depletion.

Embodiment 1

A first embodiment of the invention is described with reference to FIGS. 9A to 12B. In addition, contents which are not described in the embodiment but are described in the Description of Embodiments can be applied to the embodiment, as long as there are no special circumstances.

First, a process of manufacturing a fine particle thermoelectric element that configures a thermoelectric conversion element according to the first embodiment of the invention is described with reference to FIGS. 9A to 9E. FIG. 9A illustrates a step of preparing a SOI substrate 100 obtained by sequentially stacking a $SiO_2$ layer 102 and a monocrystal Si layer 103 on a Si substrate 101. The thickness of the Si layer 103 is set to be 20 nm. Subsequently, a resist film 104 is formed by applying a positive resist for electron beam lithography on the surface of the Si layer 103 of the SOI substrate 100 (FIG. 9B). Subsequently, the resist film 104 is patterned by electron beam lithography and a resist film 104' having plural openings is formed (FIG. 9C). The openings become in a state in which the Si layer 103 is exposed (an insulating film such as $SiO_2$ may be provided on the surface of the Si layer 103). Subsequently, a desired metallic element (herein, Mn) is doped on the Si layer 103 of the SOI substrate 100 using the patterned resist film 104' as a mask by an ion implantation 120 (FIG. 9D). In addition, a carrier type can be changed by introducing Fe, Cr, or the like having a different number of valence electrons. Subsequently, after the resist film 104' was removed, an area in which a metallic element was doped by performing a heat treatment at 700° C. is set to be a silicide layer 130, and a fine particle thermoelectric element was formed (FIG. 9E). In addition, N-type areas and P-type areas are separated and manufactured, and the areas are connected in series so that a thermoelectric conversion element can be manufactured. In addition, the embodiment is described as fine particles, but the invention may be configured with quantum dots. In addition, as the resistivity of the silicide layer, 10 μΩm to 1000 μΩm can be used. The thermoelectric conversion element using the fine particle artificial lattice system according to the embodiment can improve thermoelectric conversion efficiency by 50% to 100% compared with the case in which $Bi_2Te_3$ according to the related art was used (ZT≅1) since a dimensionless performance index ZT exceeds 3 at approximate room temperature.

Subsequently, a process of manufacturing the thermoelectric conversion module according to the embodiment is described with reference to FIGS. 10A and 10B. FIG. 10A is a perspective view illustrating a process of manufacturing the thermoelectric conversion module according to the embodiment, and illustrates a state in which plural N-type areas 140 and plural P-type areas 145 (here, in the same number as the N-type areas) are formed on the SOI substrate 100 by the process illustrated in FIGS. 9A to 9E. In addition, the detailed configurations of the N-type areas 140 and the P-type areas 145 are the same as FIG. 9E as illustrated in an enlarged view on the left side of FIG. 10A. Subsequently, an electrode in which plural N-type areas and plural P-type areas are all connected in series and two extraction electrodes 150 are formed (FIG. 10B). As the method of manufacturing the electrode, ion implantation, vacuum vapor deposition, or the like is used. Accordingly, an in-plane temperature controlling thermoelectric conversion module can be manufactured.

FIG. 11A is a perspective view for describing a flow of electrons when a voltage is applied to the thermoelectric conversion module illustrated in FIG. 10B. If the voltage is applied to a portion between the extraction electrodes, the electrons flow from the extraction electrode 150 (connected to the cathode side of power supply) on the upper rightmost portion in the drawing to the P-type areas 145, and sequentially flow to the N-type areas 140 connected in series, further to P-type areas, and to respective areas as indicated by a broken line arrow, and flows out from the extraction electrodes 150 (connected to anode side of power supply) on the upper right side in the drawing. FIG. 11B is a perspective view for describing a temperature change of a thermoelectric conversion module when the voltage is applied to the thermoelectric conversion module as illustrated in FIG. 11A. As illustrated in FIG. 11B, if the electrons flow, a central area of the thermoelectric conversion module which is a temperature controllable portion 160 is cooled down and the temperature in the circumference increases. That is, the temperature in the surface can be controlled by the thermoelectric conversion module.

A process of manufacturing another thermoelectric conversion module according to the embodiment is described with reference to FIGS. 12A and 12B. FIG. 12A is a perspective view for describing a process of manufacturing the thermoelectric conversion module according to the embodiment, and illustrates a state in which the plural N-type areas 140 and the plural P-type areas 145 (here, in the same number as the N-type areas) are formed on the SOI substrate 100 by the processes illustrated in FIGS. 9A to 9E. In addition, the detailed configurations of the N-type areas 140 and the P-type areas 145 are the same as FIG. 9E, as illustrated in an enlarged view on the left side of FIG. 10A. Subsequently, electrodes in which the plural N-type areas and the plural P-type areas are partially connected in series and the plural extraction electrodes 150 are formed (FIG. 12B). Since the voltage to be applied to each area can be changed, the in-plane temperature controlling thermoelectric conversion module in which the temperature can be controlled more accurately than the thermoelectric conversion module as illustrated in FIG. 10B can be manufactured.

As described above, according to the embodiment, even if the material system that has a low environmental load and can reduce the cost is used, the thermoelectric conversion element which has the high Seebeck coefficient, low thermal conductivity, and high performance, and the thermoelectric conversion module using the thermoelectric conversion element can be provided.

Embodiment 2

A second embodiment of the invention is described. In addition, contents which are not described in the embodiment but are described in the Description of Embodiments and Embodiment 1 can be applied to the embodiment, as long as there are no special circumstances.

FIGS. 13A and 13B are perspective views for describing a conventional thermoelectric conversion module, FIG. 13A illustrates a state in which plural N layers 240 and plural P layers 245 are disposed on plural lower electrodes 250, and FIG. 13B illustrates a state in which plural upper electrodes are disposed in a manner of being deviated to plural lower electrodes so that the plural N layers 240 and the plural P layers 245 illustrated in FIG. 13A are all connected in series. In the thermoelectric conversion module, with respect to the N layers and the P layers all connected in series, for example, if an anode side of the power supply is connected to the extraction electrode 250 on the lowermost right side of the lower electrode, the electrons flow from the extraction electrodes to the upper electrode via the N layers. The electrons flow further to the lower electrodes via the P layers neighboring the upper electrodes, and finally flow out from the extraction electrode (connected to anode side of power supply) on the lowermost left side of the lower electrodes. A thermoelectric conversion module 280 in the related art is a surface orthogonal temperature control-type thermoelectric conversion module having temperature gradient in the vertical direction on the device surface.

In the embodiment, a configuration in which the in-plane temperature controlling thermoelectric conversion module described in Embodiment 1 and the surface orthogonal temperature control-type thermoelectric conversion module in the related art are combined is described.

FIG. 14A is a perspective view illustrating a state right before the organization of the thermoelectric conversion module according to the second embodiment of the invention. The thermoelectric conversion module includes the surface orthogonal temperature control-type thermoelectric conversion module 280 in the related art, a layer 170 for transferring heat only to the circumference of an intermediate device, an in-plane temperature controlling thermoelectric conversion module 180 (intermediate device) of Embodiment 1 illustrated in FIG. 10B, the layer 170 for transferring heat only to the circumference of the intermediate device, and the surface orthogonal temperature control-type thermoelectric conversion module 280 in the related art. FIG. 14B is a perspective view illustrating a thermoelectric conversion module according to the second embodiment of the invention. According to this configuration, a thermoelectric conversion module in which the temperature in the central portion can be further decreased can be obtained.

As described above, according to the embodiment, even if the material system that has a low environmental load and can reduce the cost is used, the thermoelectric conversion module using the thermoelectric conversion element which has the high Seebeck coefficient, low thermal conductivity, and high performance can be provided. In addition, if the thermoelectric conversion module is combined with the surface orthogonal temperature control-type thermoelectric conversion module in the related art, the temperature in the central portion can be further decreased.

In the above, the invention is described in detail, and main characteristics of the invention are described below.

The density of states can be improved and thermal conductivity can be reduced by making Si and Ge, and metal compounds thereof (silicide or germanide) to be nanosize fine particles or quantum dots by using the lithography technology or the self-organization technology and by regularly arranging a portion or all of fine particles or quantum dots. In addition, if a regular arrangement is made, there is a characteristic in that the artificial lattice is formed, the energy dispersion of electrons such as a flat band creates a band structure that rarely has wavenumber dependence by the lattice of artificial fine particles, and thus a system having a great density of states is formed.

Specifically, the invention relates to the thermoelectric conversion material in which fine nanoparticles are dispersed in a host material by using Si, SiGe, silicide semiconductor FeSi, $MnSi_{1.7}$, $\beta$-$FeSi_2$, or $Mg_2Si$ as a main component or in which a regular artificial lattice is formed.

Areas having high energy potentials and low energy potentials are formed by arranging nanosize particles on the artificial lattice so that areas in which electrons are confined and which become quantum dots are formed. The semiconductor super lattice thermoelectric conversion material having characteristics in that electrons can move between the neighboring quantum dots, and the electron energy dispersion causes a flat band structure that rarely has wavenumber dependence to be included in the electron energy band by creating an artificial lattice shape in a special shape is provided.

According to the invention, by particulating semiconductor materials, the density of states is enhanced, so that the Seebeck coefficient can be increased. In addition, since the fine nanoparticles are dispersed or have a regular structure, more fine particle interfaces exist than common bulk materials, and thus thermal conductivity can be greatly reduced. In addition, a system in which fine particles are considered as artificial atoms can be manufactured by forming an artificial lattice such as a kagome lattice (referring to a pattern in which atoms and the like are arranged in a reticular pattern in the crystal lattice), and the higher thermoelectromotive force can be realized by changing the density of states in the whole system by controlling the band structure by the artificial atom system.

In addition, the invention is not limited to the embodiments described above, and various modification examples are included. For example, the embodiments above are described in detail for easier understanding of the invention, and the invention is not limited to necessarily include all the described configurations. In addition, a portion of the configurations in one embodiment can be replaced to the configuration in another embodiment, and a configuration in one embodiment can be added to a configuration in another embodiment. In addition, with respect to a portion of configurations in respective embodiments, the addition, deletion, or substitution in a different configuration can be performed.

REFERENCE SIGNS LIST

100 . . . SOI SUBSTRATE
101 . . . Si SUBSTRATE
102 . . . $SiO_2$ LAYER
103 . . . Si LAYER
104, 104' . . . RESIST FILM
120 . . . ION IMPLANTATION
130 . . . SILICIDE LAYER
140 . . . N-TYPE AREA
145 . . . P-TYPE AREA
150 . . . ELECTRODE
160 . . . TEMPERATURE CONTROLLABLE PORTION
170 . . . LAYER FOR TRANSFERRING HEAT ONLY TO THE CIRCUMFERENCE OF AN INTERMEDIATE DEVICE
180 . . . IN-PLANE TEMPERATURE CONTROLLING THERMOELECTRIC CONVERSION MODULE
240 . . . N LAYER
245 . . . P LAYER
250 . . . ELECTRODE
280 . . . THERMOELECTRIC CONVERSION MODULE IN THE RELATED ART

The invention claimed is:

1. A thermoelectric conversion element, comprising:
a thin film material having a lattice structure, wherein a main component of the thin film material includes at least one selected from Fe, Mn, Ti, Mg, V, Cr, Mo, Zr, Ru, Os, Rh, Re, Ir and Co,
wherein a first area of the lattice structure having a first conductivity type and a second area of the lattice structure having a second conductivity type different than the first conductivity type,
wherein the first and second areas are either nanoparticles or semiconductor quantum dots arranged in the lattice structure,
wherein the lattice structure includes first lattice points and second lattice points, and
wherein a number of the first lattice points is different than a number of the second lattice points.

2. A thermoelectric conversion element, comprising:
a thin film material having a lattice structure, wherein the thin film material has a main component one selected from $Mn_4Si_7$, $Mg_2Si$, $MoSi_2$, $TiSi_2$, $TiGe_2$, $FeSi$, $\beta\text{-}FeSi_2$, $V_{17}Ge_{31}$, $Cr_{11}Ge_{19}$, $Mo_9Ge_{16}$, $Mo_{13}Ge_{22}$, $ZrSn_2$, $RuGe_3$, $Ru_2Si_3$, $Os_2Ge$, $Os_2Si_3$, $Rh_{17}Ge_{22}$, $Re_4Ge_7$, $Mn_{11}Si_{19}$, $Mn_{15}Si_{26}$, $Mn_{27}Si_{47}$, $Mn_{26}Si_{45}$, $Mn_7Si_{12}$, $Mn_{19}Si_{33}$, $Mn_{39}Si_{68}$, $Ir_4Ge_5$, $Co_2Si_3$ and a Heulser alloy,
wherein a first area of the lattice structure has a first conductivity type and a second area of the lattice structure has a second conductivity type different than the first conductivity type,
wherein the first and second areas are either nanoparticles or semiconductor quantum dots arranged in the lattice structure, and
wherein a unit structure of the lattice structure has all vertexes of unit structure connected by edges of the unit structure.

3. A thermoelectric conversion element, comprising:
a thin film material having a lattice structure, wherein the thin film material has a main component one selected from $Mn_4Si_7$, $Mg_2Si$, $MoSi_2$, $TiSi_2$, $TiGe_2$, $FeSi$, $\beta\text{-}FeSi_2$, $V_{17}Ge_{31}$, $Cr_{11}Ge_{19}$, $Mo_9Ge_{16}$, $Mo_{13}Ge_{22}$, $ZrSn_2$, $RuGe_3$, $Ru_2Si_3$, $Os_2Ge$, $Os_2Si_3$, $Rh_{17}Ge_{22}$, $Re_4Ge_7$, $Mn_{11}Si_{19}$, $Mn_{26}Si_{26}$, $Mn_{27}Si_{47}$, $Mn_{26}Si_{45}$, $Mn_7Si_{12}$, $Mn_{19}Si_{33}$, $Mn_{39}Si_{68}$, $Ir_4Ge_5$, $Co_2Si_3$ and a Heulser alloy,
wherein a first area of the lattice structure has a first conductivity type and a second area of the lattice structure has a second conductivity type different than the first conductivity type,
wherein the first and second areas are either (i) nanoparticles arranged in a lattice structure to form a nanocomposite or (ii) semiconductor quantum dots arranged in the lattice structure to form a semiconductor thin film, and
wherein the lattice structure is comprised of (i) a kagome lattice structure, and (ii) an auxiliary lattice structure, the kagome lattice structure being different than the auxiliary lattice structure.

4. The thermoelectric conversion element according to claim 1,
wherein a main component of a thin film material having the lattice structure is at least one selected from $Mn_4Si_7$, $Mn_2Si$, $TiSi_2$, $TiGe_2$, $FeSi$, $\beta\text{-}FeSi_2$, $V_{17}Ge_{31}$, $Cr_{11}Ge_{19}$, $Mo_9Ge_{16}$, $ZrSn_2$, $RuGe_3$, $Ru_2Si_3$, $Os_2Ge$, $Os_2Si_3$, $Rh_{17}Ge_{22}$, $Re_4Ge_7$, $Mn_{11}Si_{19}$, $Mn_{15}Si_{26}$, $Mn_{27}Si_{47}$, $Mn_{26}Si_{45}$, $Mn_7Si_{12}$, $Mn_{19}Si_{33}$, $Mn_{39}Si_{33}$, $Ir_4Ge_5$, $Co_2Si_3$ and a Heulser alloy.

5. A thermoelectric conversion module, comprising:
the thermoelectric conversion element according to claim 1.

6. A thermoelectric conversion module, comprising:
the thermoelectric conversion element according to claim 2.

7. A thermoelectric conversion module, comprising:
the thermoelectric conversion element according to claim 3.

8. The thermoelectric conversion module according to claim 5, further comprising:
- an in-plane temperature controlling thermoelectric conversion module; and
- a surface orthogonal temperature control-type thermoelectric conversion module.

9. The thermoelectric conversion module according to claim 6, further comprising:
- an in-plane temperature controlling thermoelectric conversion module; and
- a surface orthogonal temperature control-type thermoelectric conversion module.

10. The thermoelectric conversion module according to claim 7, further comprising:
- an in-plane temperature controlling thermoelectric conversion module; and
- a surface orthogonal temperature control-type thermoelectric conversion module.

11. The thermoelectric conversion element of claim 1, wherein the first and second lattice points are in the form of a flat band, the flat band being a band structure in which energy dispersion of electrons rarely is independent of wavenumber.

12. The thermoelectric conversion element of claim 2, wherein the first and second lattice points are in the form of a flat band, the flat band being a band structure in which energy dispersion of electrons rarely is independent of wavenumber.

13. The thermoelectric conversion element of claim 3, wherein the first and second lattice points are in the form of a flat band, the flat band being a band structure in which energy dispersion of electrons rarely is independent of wavenumber.

14. The thermoelectric conversion element of claim 1, wherein the one selected from nanoparticles and semiconductor quantum dots are regularly arranged in an artificial lattice structure, the artificial lattice structure being the lattice structure.

15. The thermoelectric conversion element of claim 2, wherein the one selected from nanoparticles and semiconductor quantum dots are regularly arranged in an artificial lattice structure, the artificial lattice structure being the lattice structure.

16. The thermoelectric conversion element of claim 3, wherein the one selected from nanoparticles and semiconductor quantum dots are regularly arranged in an artificial lattice structure, the artificial lattice structure being the lattice structure.

* * * * *